(12) United States Patent
Hutchison et al.

(10) Patent No.: US 6,404,637 B2
(45) Date of Patent: Jun. 11, 2002

(54) CONCENTRICAL SLOT TELECOMMUNICATIONS EQUIPMENT ENCLOSURE

(75) Inventors: Randall D. Hutchison, Shawnee; Robert Shiffbauer, Olathe; Kevan Smith, Overland Park, all of KS (US)

(73) Assignee: Special Product Company, Overland Park, KS (US)

( * ) Notice: Subject to any disclaimer, the term of this patent is extended or adjusted under 35 U.S.C. 154(b) by 0 days.

(21) Appl. No.: 09/781,176

(22) Filed: Feb. 12, 2001

Related U.S. Application Data

(60) Provisional application No. 60/221,235, filed on Jul. 7, 2000, and provisional application No. 60/182,299, filed on Feb. 14, 2000.

(51) Int. Cl.$^7$ .................................................. H05K 7/20
(52) U.S. Cl. ........................ 361/704; 361/688; 361/721; 165/80.3; 165/185
(58) Field of Search .............................. 361/704, 707, 361/708, 710, 711, 717–719, 726, 727, 679, 688, 687; 165/80.3, 185; 174/16.3, 50.51

(56) References Cited

U.S. PATENT DOCUMENTS

| 4,449,576 A | 5/1984 | Baum et al. |
| 4,465,899 A | 8/1984 | Mauclere et al. |

(List continued on next page.)

FOREIGN PATENT DOCUMENTS

| GB | 2193552 | 2/1988 | ............ H04B/9/00 |
| JP | 57102058 | 6/1982 | ............ H01L/23/34 |
| JP | 6079834 | 5/1985 | ............ H04B/3/02 |
| JP | 865868 | 3/1996 | ............ H02G/9/02 |

OTHER PUBLICATIONS

Thermacore Inc. sales brochure, "heat pipes for electronics cooling applications", 4 page.

Thermacore Inc. Product Data Guide, "Miniature Heat Pipes," Sep. 24, 1996, 1 page.

Thermacore Inc. brochure, "Common Questions About Heath Pipes," Sep. 23, 1996, 2 pages.

Thermacore Inc. sales brochure, "The Leader in Heath Pipe Technology", 4 pages.

*Primary Examiner*—Boris Chervinsky
(74) *Attorney, Agent, or Firm*—Hovey Williams LLP

(57) ABSTRACT

A telecommunications equipment enclosure (10) that dissipates into the ambient environment heat internally generated by signal repeater cards and other electronic equipment stored therein, thereby prolonging equipment life and preventing premature failure due to damaging levels of retained heat. Equipment-receiving sleeves (20) are removably arranged concentrically about the interior of a cylindrical housing (12). The housing (12) is fitted with a lid (14) having a cylindrically protruding portion (48). Cooling fins (16) operable to conduct and dissipate heat are attached to the exterior of the housing (12). Each sleeve (20) is able to conduct heat away from the heat-generating equipment received therein, and to transfer the heat along two distinct thermally conductive pathways. Surge protection (60) is provided on a removable circuit board (62) located adjacent each sleeve (20) and replaceable without removing the sleeve (20) or otherwise disrupting functioning of the cards or other electronic equipment.

7 Claims, 4 Drawing Sheets

U.S. PATENT DOCUMENTS

| | | | |
|---|---|---|---|
| 4,528,615 A | | 7/1985 | Perry |
| 4,679,250 A | | 7/1987 | Davis et al. |
| 4,858,068 A | | 8/1989 | Bitller et al. |
| 4,962,445 A | * | 10/1990 | Pelet et al. .................. 361/722 |
| 5,060,115 A | * | 10/1991 | Sewell ........................ 361/710 |
| 5,105,337 A | | 4/1992 | Bitller et al. |
| 5,251,099 A | * | 10/1993 | Goss et al. .................. 361/721 |
| 5,329,425 A | | 7/1994 | Leyssens et al. |
| 5,343,358 A | | 8/1994 | Hilbrink |
| 5,777,846 A | | 7/1998 | Hayes et al. |
| 5,842,514 A | | 12/1998 | Zapach et al. |
| 5,844,777 A | | 12/1998 | Gates |
| 5,883,784 A | * | 3/1999 | Hughes et al. ............... 361/707 |
| 5,896,268 A | | 4/1999 | Beavers |
| 5,930,113 A | * | 7/1999 | McCann ..................... 361/704 |
| 5,943,219 A | * | 8/1999 | Bellino et al. .............. 361/816 |
| 5,949,650 A | | 9/1999 | Bulante et al. |
| 6,025,991 A | * | 2/2000 | Saito ......................... 361/704 |
| 6,028,769 A | * | 2/2000 | Zurek ........................ 361/704 |
| 6,046,908 A | * | 4/2000 | Feng .......................... 361/707 |
| 6,055,157 A | | 4/2000 | Bartilson |
| 6,104,611 A | | 8/2000 | Glover et al. |
| 6,118,662 A | | 9/2000 | Hutchison et al. |
| 6,244,332 B1 | * | 6/2001 | Gesklin et al. ............. 165/80.3 |
| 6,252,775 B1 | * | 6/2001 | Kuroda ....................... 361/707 |
| 6,292,556 B1 | | 9/2001 | Laetsch |

* cited by examiner

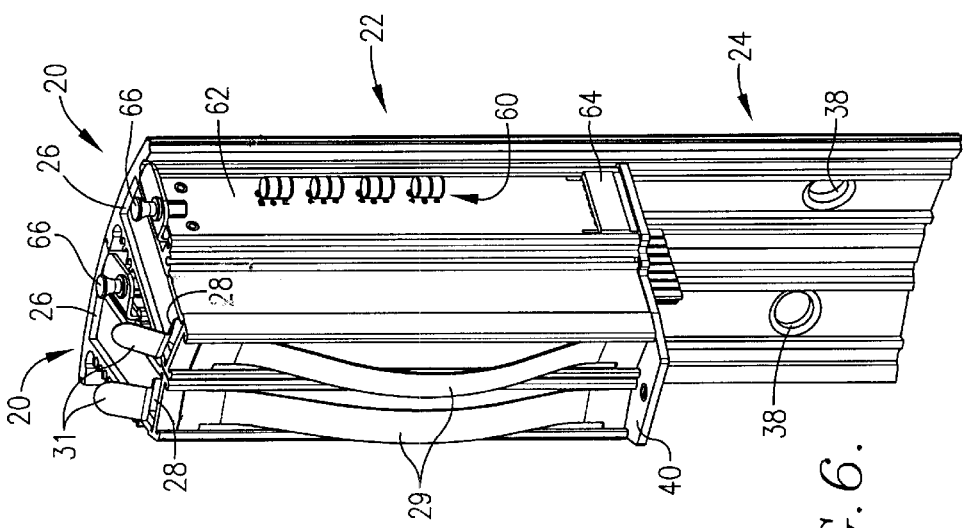
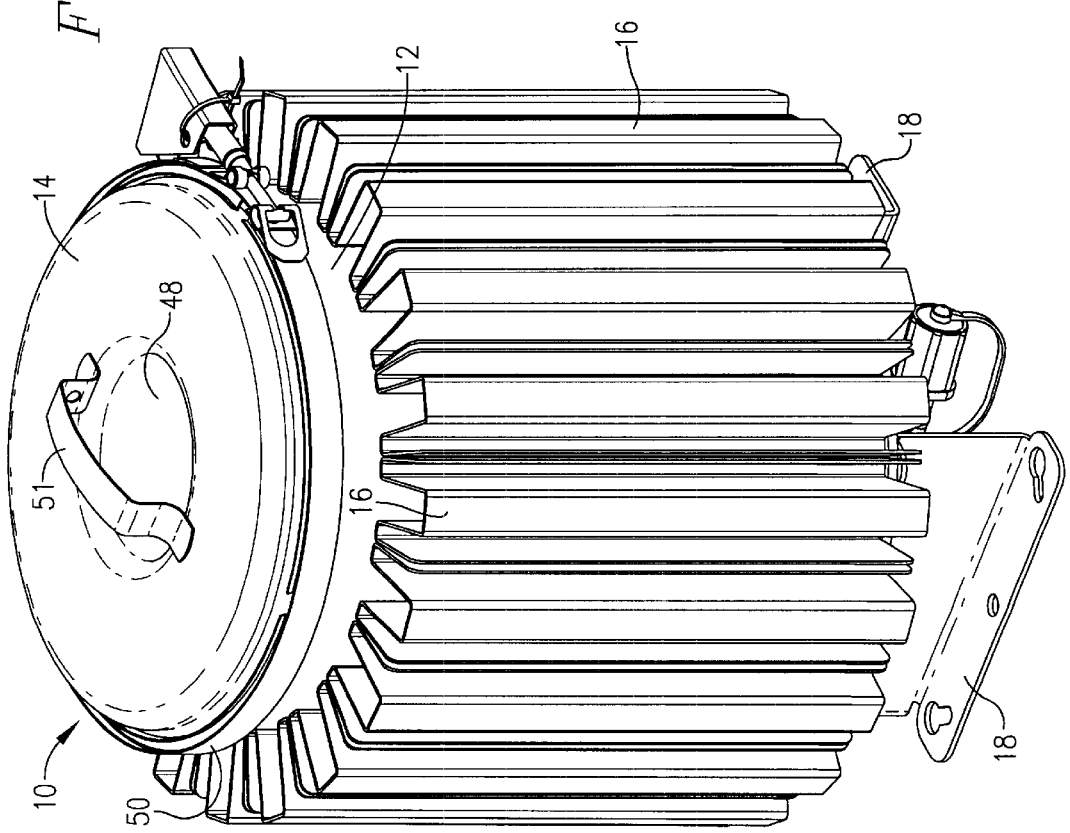

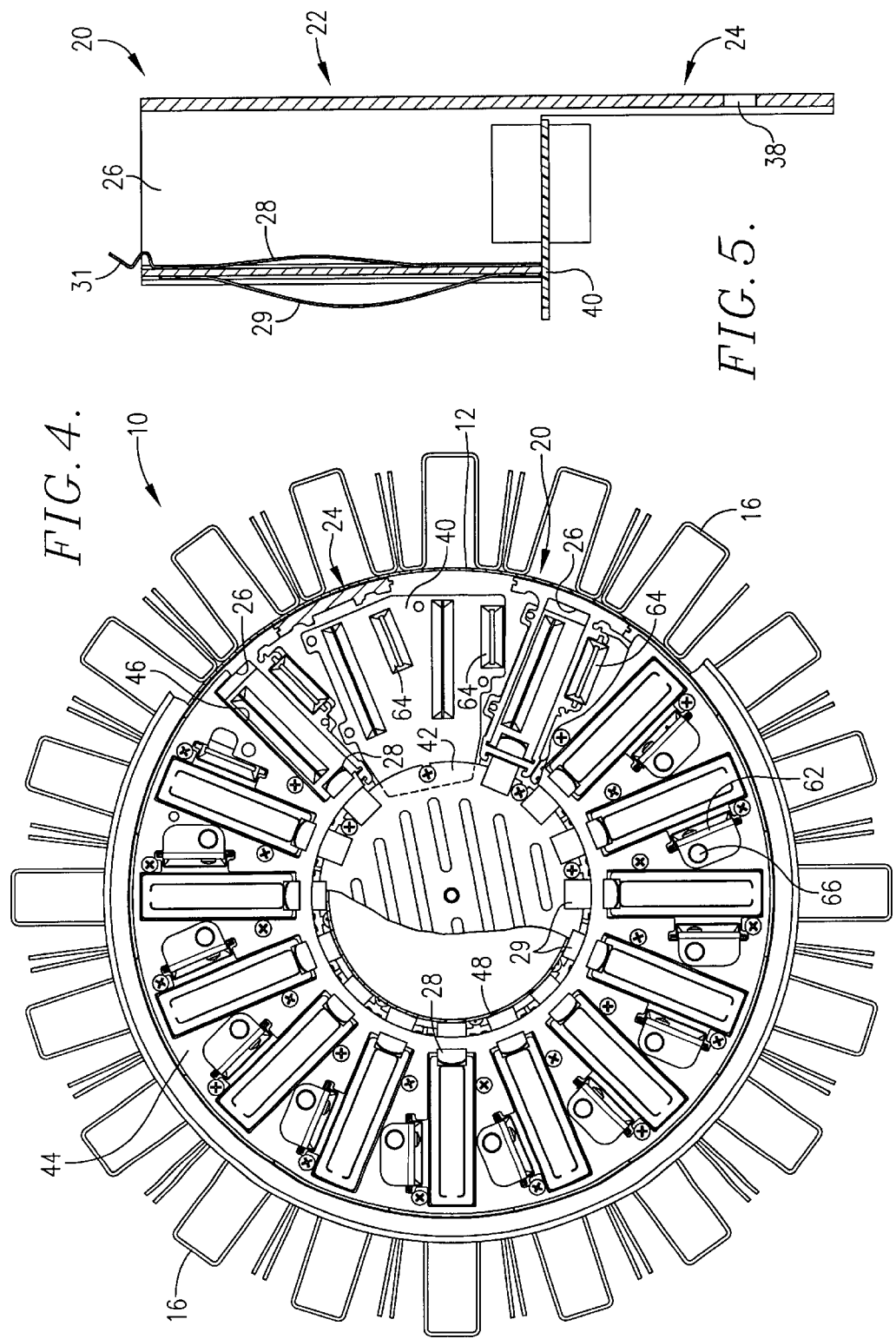

CONCENTRICAL SLOT TELECOMMUNICATIONS EQUIPMENT ENCLOSURE

RELATED APPLICATIONS

This application claims priority benefit, with regard to all common subject matter, of provisional application titled "Radial Slot Telecommunications Enclosure", Ser. No. 60/182,299, filed Feb. 14, 2000, and provisional application titled "Enclosure for Telecommunications Equipment", Ser. No. 60/221,235, filed Jul. 7, 2000, both of which are hereby incorporated into the present application by reference.

BACKGROUND OF THE INVENTION

1. Field of the Invention

The present invention relates to telecommunications equipment. More particularly, the present invention relates to a telecommunications equipment enclosure for protectively housing and cooling heat-generating electronic equipment such as signal repeaters.

2. Description of the Prior Art

Telecommunications signal repeaters and other electronic equipment used by providers of telecommunications services are typically housed in enclosures that are mounted to telephone poles or placed next to buildings or in manholes. The enclosures must protect the electronic equipment from environmental hazards such as sun, rain, snow, and fire, as well damage from vandalism and attempted theft. With regard to signal repeaters in particular, the enclosures must safely and securely house multiple repeater units or "cards" in a space efficient manner while allowing for the dissipation of potentially damaging levels of heat generated by the repeater cards and other electronic equipment.

Electricity to power fans or other artificial cooling means is typically not available to the enclosures and so heat dissipation must be accomplished naturally. One problem with existing enclosure designs is that they do not make the most efficient use of natural cooling mechanisms. Thus, for example, cooling problems are exacerbated in enclosures wherein the repeater cards are arranged within the housing such that generated heat is retained and transferred between adjacent cards and equipment rather than to the environment surrounding the enclosures.

Furthermore, existing enclosures typically place surge protection mechanisms beneath the electronic equipment where the protection connects to both the equipment and cables which exit a lower portion of the enclosure. Unfortunately, this arrangement requires that the electronic equipment be removed from the enclosure or its function otherwise disrupted whenever the surge protection mechanism is replaced.

Due to the above-identified and other limitations of the current art, a need exists for an improved telecommunications equipment enclosure.

SUMMARY OF THE INVENTION

The present invention solves the above-described and other problems and provides a distinct advance in the art of enclosures for telecommunications equipment. More particularly, the present invention provides an enclosure that more effectively dissipates heat from signal repeater cards and other electronic equipment, thereby prolonging equipment life and preventing premature failure due to damaging levels of retained, internally generated heat.

In a preferred embodiment, the enclosure comprises a housing; a lid; cooling fins; and a plurality of card/equipment receiving sleeves. The housing is preferably cylindrical and presents a top access opening to which the lid closably corresponds. In underground applications, the interior surface of the closed lid projects cylindrically into and substantially parallel to the cylindrical housing. In above ground applications, a domed cover is added to more effectively shed water. The cooling fins operate to conduct heat away from the housing and dissipate it into the ambient environment. The cooling fins are formed from substantially W-shaped pieces of metal, with the lower apexes providing attachment points for securing the fins to the exterior housing surface, and the upright legs providing cooling surfaces extending substantially perpendicularly away from the housing. The sleeves are operable to receive and electrically connect to the cards or other equipment, and are removably arranged concentrically about the interior of the housing. Furthermore, gas tube lightening surge protection is provided mounted to removable circuit boards located adjacent each sleeve and replaceable without removing the sleeve or otherwise disrupting the function of the card or other electronic equipment.

In operation, a card may be removed from or placed within a sleeve, either while the sleeve is received within the housing or while removed therefrom. An operational card generates heat which is conducted to the surrounding sleeve. The sleeve is then able to transfer heat along two thermally conductive pathways. Along a first pathway, heat is transferred from an outer sleeve portion to the housing, and then to the fins wherefrom it is dissipated into the ambient environment. Along a second pathway, heat is transferred from an inner sleeve portion to a leaf spring coupled therewith, and then to the inwardly projecting cylindrical lid portion whereafter it is dissipated into the ambient environment.

These and other features of the present invention are more fully described below in the section entitled DETAILED DESCRIPTION OF A PREFERRED EMBODIMENT.

BRIEF DESCRIPTION OF THE DRAWING FIGURES

A preferred embodiment of the present invention is described in detail below with reference to the attached drawing figures, wherein:

FIG. 1 is an isometric view of a telecommunications equipment enclosure constructed in accordance with a preferred embodiment of the present invention;

FIG. 4 is a top view of the enclosure with the top cover removed;

FIG. 5 is cross-sectional view of a card-receiving sleeve for use with the enclosure of FIG. 1; and FIG. 6 is an isometric view of a card-receiving sleeve for use with the enclosure of FIG. 1.

DETAILED DESCRIPTION OF A PREFERRED EMBODIMENT

Figure 2:
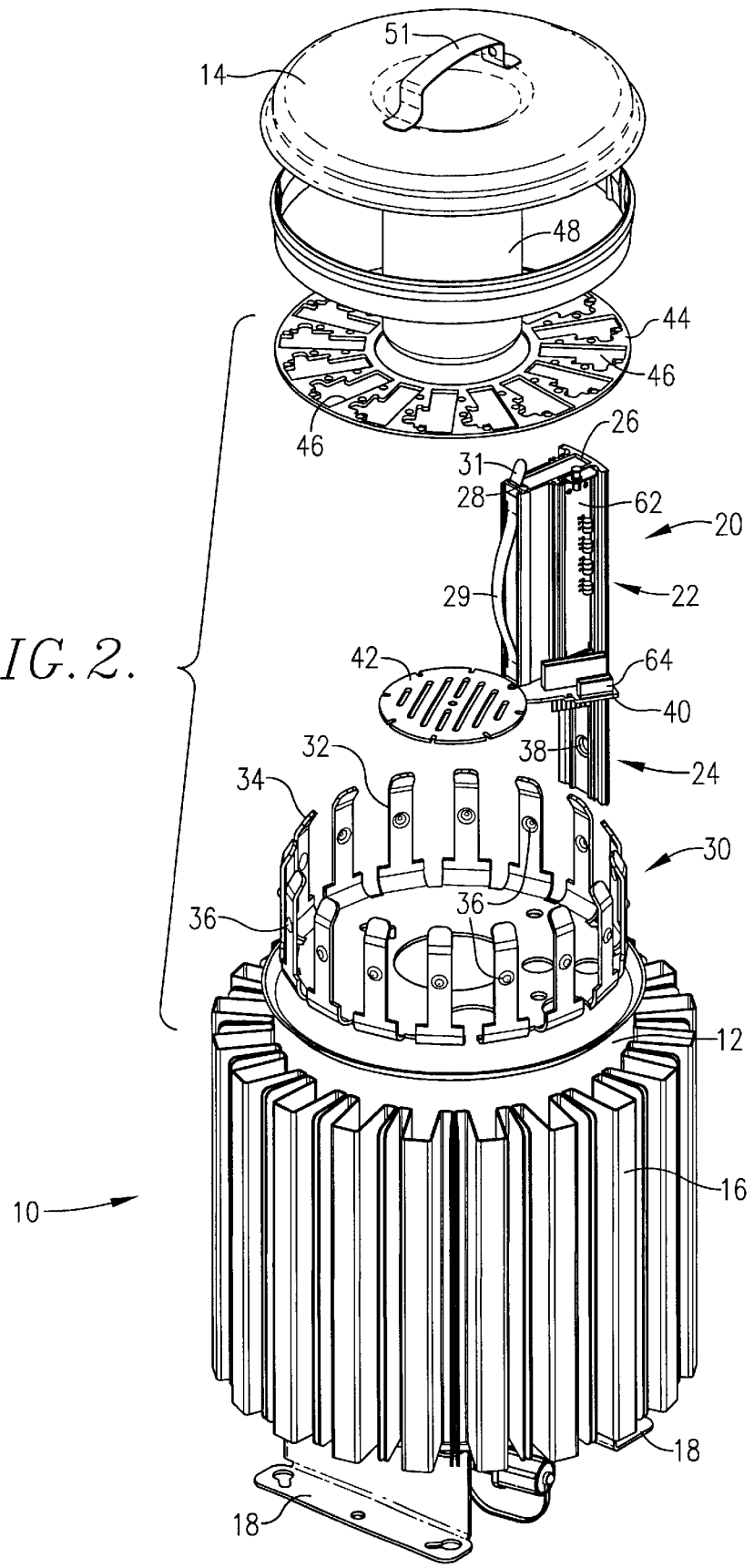
FIG. 2 is an exploded isometric view of the enclosure of FIG. 1.

Referring to FIG. 1, a telecommunications equipment enclosure 10 is shown constructed in accordance with a preferred embodiment of the present invention, and operable to protectively house and cool signal repeater cards and other electronic equipment contained therein. The preferred enclosure 10 provides at least two thermally conductive pathways for conducting internally generated and potentially damaging heat away from the enclosure 10 and dissipating the heat into the surrounding environment. The enclosure 10 broadly comprises an outer housing 12; a lid 14; a plurality of heat-dissipating fins 16; at least one mounting mechanism 18; and a plurality of card receiving sleeves 20.

The outer housing 12 is operable to protectively enclose electronic equipment placed therein. The housing 12 is preferably cylindrical in shape, with a top portion presenting an access opening, and is preferably made of stainless steel. Where desirable and practical, other shapes, such as square or rectangular, and materials, such as aluminum, may be used without departing from the contemplated scope of the present invention.

The lid 14 substantially seals and protects the housing's interior from various environmental conditions, including dust, moisture, and wildlife, while providing a convenient means of accessing the contents located therein. For underground or other sheltered applications, the lid 14 preferably includes a cylindrically protruding portion 48 which extends downwardly into the housing 12 when the lid is closedly positioned over the access opening. For outdoor applications, a domed cover (not shown) is added to the lid 14 or the lid 14 is otherwise adapted to shed water. Alternatively, for outdoor applications exposed to the natural elements, the cylindrical protrusion 48 may be fitted with bottom drain holes (not shown), or may extend entirely through the housing so as to form a substantially doughnut-shaped enclosure (not shown). The lid preferably includes a handle portion 51 for convenient use.

The lid 14 is shown securely fastened to the housing 12 by a common ring clamp 50 operable to expand to fit over the lid/housing interface and then compress to tightly engage both lid and housing surfaces and prevent relative movement thereof. Expansion and compression of the ring clamp 50 may be accomplished by a levered, threaded, or other mechanism, as is well known.

The heat-dissipating fins 16 are operable to naturally conduct heat away from the housing 12 and dissipate it into the ambient environment. The ability of the fins 14 to conduct and dissipate heat depends on various factors, including the amount of surface area they present and the material of which they are made. Preferably, the fins 16 are formed of a plurality of W-shaped segments arranged adjacent to one another about the housing's exterior. This shape presents a large total surface area for dissipating heat. Furthermore, in order to facilitate thermal conduction, the fins 16 are preferably made of metal and attached to the housing 12 using metal-to-metal contact. Other fin designs and arrangements may be used depending on heat dissipation requirements and environmental conditions. For example, the fins may take the form of a plurality of simple rectangular strips of metal arranged and attached radially about the housing exterior; or the fins may be formed from a long, single piece of metal corrugated so as to present ridges and grooves, with the grooves providing attachment points and the ridges providing cooling surfaces. In some applications, fins may be eliminated altogether as the housing surface itself provides sufficient heat dissipation.

The mounting mechanism 18 provides a coupling means with which to secure the enclosure 10 to a wall, pole, or other structure as required. Although shown as two L-shaped mounting brackets 18 having first ends attached to the housing 12 and second ends adapted to receive fasteners, the nature and design of the mounting mechanism 18 is application dependent.

Referring to FIG. 2, the card-receiving sleeves 20 are positioned within the housing 12. Each sleeve 20 is configured to receive one or more single-wide or double-wide signal repeater card or other electronic equipment. Referring also to FIGS. 5 and 6, each sleeve 20 comprises an upper portion 22, which includes one or more generally rectangular card slots 26, and a depending leg portion 24.

Each rectangular card slot 26 is adapted to receive a signal repeater card. As best shown in FIG. 5, an elongated inner leaf spring 28 is included within each slot 26 along the inner wall of the upper portion 22 of each sleeve 20 for biasing the repeater card received therein outwardly against the outer sleeve wall, thereby improving conduction of heat from the card to the outer wall of the sleeve 20. A tang portion 31 of the leaf spring 28 extends above the card slot 26 and functions to releasably hold the card securely within the slot 26. Once the tang 31 of the spring 28 has engaged the inserted card, the tang 31 must be depressed to allow subsequent withdrawal of the card from the slot 26.

Each sleeve 20 also includes one or more elongated outer leaf springs 29 positioned in one or more channels along the sleeve's innermost edge. The leaf springs 29 compressively contact the cylindrically protruding interior surface portion 48 of the closed lid 14 to improve thermal conduction from the sleeve 20 to the lid 14. Though shown as providing only a single point of contact with the interior surface portion 48, it may be preferable that the spring 29 take an alternative shape, such as serpentine or corrugated, thereby providing additional contact points for heat transfer.

A circuit board 40 operable to electrically condition and connect the signal repeater card is coupled with the upper portion 22 of each sleeve 20. The circuit board 40 is further electrically connected to associated wiring (not shown) that enters the bottom of the enclosure 10. A circular grounding plate 42 interconnects all of the circuit boards 40 and serves as an electrical ground.

Each sleeve 20 also includes a number of gas tube lightning surge protectors 60 mounted on a removable circuit board 62. Each circuit board 62 is received within a slot along one side of the sleeve 20 to electrically engage an electrical connector 64 located at the bottom thereof and connected to associated wiring (not shown). Furthermore, each board 62 is provided with a knob 66 to facilitate easier handling, particularly when withdrawing the engaged board 62 from the enclosure 10. This arrangement allows the circuit boards 62 to be easily removed and replaced without removing the sleeve 20 or otherwise disrupting the cards or other electronic equipment.

The upper portions of the sleeves 20 are interconnected by a ring-shaped mounting plate 44 that fastens to the sleeves 20, preferably using a screw or other suitable fastener. The mounting plate 44 includes a plurality of generally rectangular-shaped cutouts 46 for permitting insertion and removal of the signal repeater cards from the sleeves 20 once the plate 44 is fastened in place.

The depending leg portions 24 of the sleeves 20 are held against the bottom of the housing 12 by a circular spring assembly 30, having a plurality of upstanding spring elements 32. The spring elements 32 function to bias the sleeves 20 against the interior wall of the housing 12 to improve conduction of heat therebetween. Each spring element 32 has an inwardly projecting tang 34 that guides the leg portion 24 of the sleeve 20 as it is inserted between the spring element 32 and the interior wall of the housing 12. Each spring element 32 also has a detent 36 that fit into a corresponding hole 38 on the leg portion of a fully inserted sleeve 20 to lock the sleeve 20 into its correct operating position at the bottom of the housing 12. The tang 34 is further operable to provide a means of releasing the detent and unlocking the sleeve 20 for removal.

In some embodiments, the sleeves 20 are not the discrete pieces of individually removable hardware shown in FIG. 2. Instead, one or more individually removable block sections are provided, each of which incorporates a plurality of sleeves, wherein each such entire section is spring-biased against the interior housing and lid surfaces 12,48. For example, though FIGS. 2 and 4 show each sleeve 20 as a discrete component and individually removable, one may imagine that two or four or more sleeves 20 are combined in a single block section such that removal of one of the sleeves requires removal of the entire block section of which it is an integral part. Such a configuration allows, for example, for quicker removal and replacement of large numbers of sleeves. It is further contemplated that some applications may require or prefer that all sleeves be incorporated into a single, removable unit, each sleeve being an integral part thereof.

In operation, a technician desiring to remove or insert signal repeater cards into the sleeves 20 of the enclosure may remove the lid 14 by expanding the ring clamp 50 and releasing it from the housing 12, and then pulling the lid 14 upward to withdraw the cylindrically protruding portion 48 therefrom. With the lid 14 removed, the access opening is exposed and, looking down into the housing 12, the technician will be presented with the view shown in FIG. 4. Signal repeater cards may then be easily inserted into the rectangular card slots 26 of the sleeves 20 or removed therefrom. Once inserted, the inner leaf spring 28 forces the card into positive contact with the back wall of the slot 26, and the tang portion 31 of the spring 28 slips over a top portion of the card to securely retain it therein. To remove a card, the tang 31 is depressed until the card can be freely withdrawn from the slot 26.

The sleeves 28 themselves may be removed by first unscrewing and removing the grounding plate 42 and unscrewing and removing the mounting plate 44. The technician is then able to reach into the housing 12 to depress the tang 34 of the spring element 32 associated with the sleeve 20 to be removed. Depressing the tang 34 causes the detent 36 to release from the corresponding hole 38 in the leg portion 24 of the sleeve 20, thereby unlocking the sleeve 20 and permitting its removal through the top of the housing 12. Replacing the sleeve 20 is accomplished by performing the steps of the removal process in reverse order. Note, however, that the step of depressing the tang 34 is unnecessary as its shape will allow the sleeve 20 to automatically slip behind the spring element 32 and engage the detent 36 as the operator pushes the sleeve 20 into its proper position at the bottom of the housing 12.

Figure 3:
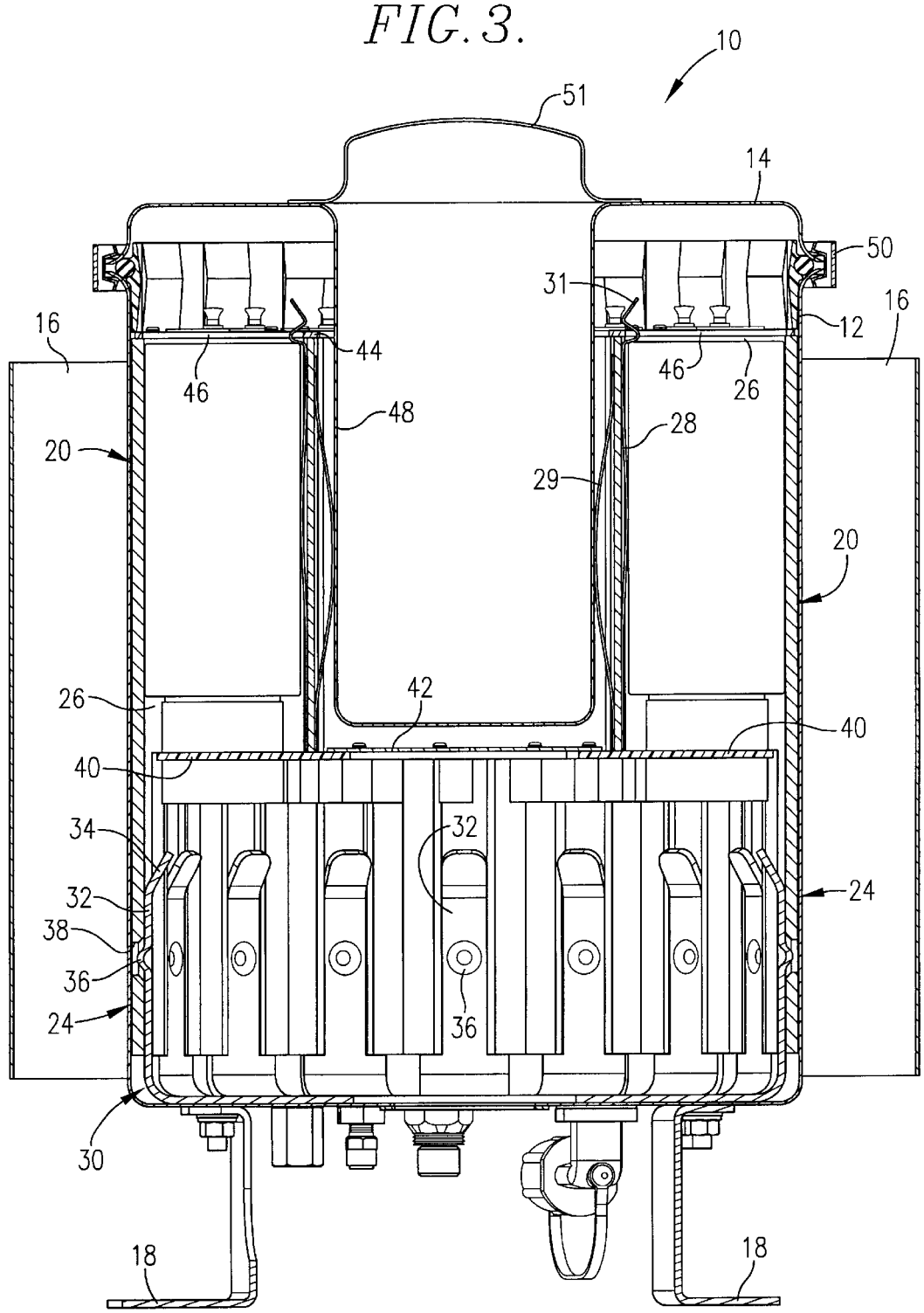
FIG. 3 is a cross-sectional view of the enclosure of FIG. 1.

FIG. 3 shows the assembled enclosure 10 with sleeves 20 in place. As is evident from FIG. 3, an operational, heat generating card located within the rectangular slot 26 of a sleeve 20 is able to transfer heat along two different thermally conductive pathways. Along a first pathway, heat is transferred from the card to an outer portion of the sleeve 20, then to the housing 12, and then to the fins 16 wherefrom it is dissipated into the ambient environment. Along a second pathway, heat is transferred from the card to the leaf spring 28, then to an inner portion of the sleeve 20, then to the leaf spring 29 coupled therewith, and then to the inwardly projecting cylindrical lid portion 48 whereafter it is dissipated into the ambient environment.

Although the invention has been described with reference to the preferred embodiment illustrated in the attached drawing figures, it is noted that equivalents may be employed and substitutions made herein without departing from the scope of the invention as recited in the claims. For example, as noted above, the present invention is adaptable to various housing, lid, and fin shapes, mounting arrangements, and materials. Furthermore, although described primary as a housing for signal repeater cards, the present invention is adaptable to accommodate a variety of electronic equipment.

Having thus described the preferred embodiment of the invention, what is claimed as new and desired to be protected by Letters Patent includes the following:

1. An enclosure for housing electronic equipment, the enclosure comprising:
   a protective housing having exterior and interior housing surfaces and having an access opening;
   a removable lid closably positionable over the access opening, the housing and lid together defining an interior compartment, with the lid having an exterior lid surface and an interior lid surface, and the interior lid surface presenting a protrusion which projects substantially inward relative to the housing when the lid is closedly positioned thereupon; and
   a plurality of sleeves arranged about the interior compartment and operable to receive the electronic equipment, each sleeve having an outer sleeve portion providing a thermally conductive pathway to the interior housing surface, and each sleeve having an inner portion in direct contact with the interior lid surface.

2. An enclosure for housing electronic equipment, the enclosure comprising:
   a protective housing having exterior and interior housing surfaces and having an access opening;
   a removable lid closably positionable over the access opening, the housing and lid together defining an interior compartment, with the lid having an exterior lid surface and an interior lid surface, and the interior lid surface presenting a protrusion which projects substantially inward relative to the housing when the lid is closedly positioned thereupon; and
   a plurality of sleeves arranged about the interior compartment and operable to received the electronic equipment, each sleeve having an outer sleeve portion providing a thermally conductive pathway to the interior housing surface, and each sleeve having an inner portion including a spring in compressive, thermally conductive contact with the interior lid surface.

3. The enclosure as set forth in claim 2, wherein the spring is serpentine in shape so as to provide multiple thermally conductive contact points.

4. An enclosure for housing electronic equipment, the enclosure comprising:
   a protective housing having exterior and interior housing surfaces and having an access opening;
   a removable lid closably positionable over the access opening, the housing and lid together defining an interior compartment;
   a plurality of sleeves arranged about the interior compartment and operable to receive the electronic equipment, each sleeve having an outer sleeve portion providing thermally conductive pathway to the interior housing surface; and
   a plurality of surge protection boards, each being associated with and located adjacent to a different one of the sleeves and removable from the enclosure without removing the associated sleeve.

5. An enclosure for housing electronic equipment, the enclosure comprising:
- a protective housing having exterior and interior housing surfaces and having an access opening;
- a removable lid having exterior and interior lid surfaces, the lid being closably positionable over the access opening, the interior lis surface presenting a protrusion which projects substantially inward relative to the housing when the lid is closedly positioned thereupon, the housing and lid together defining an interior compartment;
- a plurality of cooling fins arranged about and attached to the exterior housing surface and operable to conduct heat away from the exterior housing surface and dissipate the heat into an ambient environment; and
- a plurality of sleeves arranged about the interior compartment and operable to receive the electronic equipment, each sleeve having an outer sleeve portion providing a thermally conductive pathway to the interior housing surface, and an inner sleeve portion positioned in direct contact with the interior lid surface so as to provide a thermally conductive pathway to the interior lid surface.

6. An enclosure for housing electronic equipment, the enclosure comprising:
- a protective housing having exterior and interior housing surfaces and having an access opening;
- a removable lid having exterior and interior lid surfaces, the lid being closably positionable over the access opening, the interior lid surface presenting a protrusion which projects substantially inward relative to the housing when the lid is closedly positioned thereupon, the housing and lid together defining an interior compartment;
- a plurality of cooling fins arranged about and attached to the exterior housing surface and operable to conduct heat away from the exterior housing surface and dissipate the heat into an ambient environment; and
- a plurality of sleeves arranged about the interior compartment and operable to receive the electronic equipment, each sleeve having an outer sleeve portion providing a thermally conductive pathway to the interior housing surface, and an inner sleeve portion including a spring in compressive, thermally conductive contact with the inwardly projecting protrusion of the interior lid surface so as to provide a thermally conductive pathway to the interior lid surface.

7. An enclosure for housing electronic equipment, the enclosure comprising:
- a protective housing having exterior and interior housing surfaces and having an access opening;
- a removable lid having exterior and interior lid surfaces, the lid being closably positionable over the access opening, the interior lid surface presenting a protrusion which projects substantially inward relative to the housing when the lid is closedly positioned thereupon, the housing and lid together defining an interior compartment;
- a plurality of cooling fins arranged about and attached to the exterior housing surface and operable to conduct heat away from the exterior housing surface and dissipate the heat into an ambient environment;
- a plurality of sleeves arranged about the interior compartment and operable to receive the electronic equipment, each sleeve having an outer sleeve portion providing a thermally conductive pathway to the interior housing surface, and an inner sleeve portion providing a thermally conductive pathway to the interior lid surface and;
- a plurality of surge protection boards, each being associated with and located adjacent to a different one of the sleeves and removable from the enclosure without removing the associated sleeve.

* * * * *

UNITED STATES PATENT AND TRADEMARK OFFICE
CERTIFICATE OF CORRECTION

PATENT NO.    : 6,404,637 B2
DATED         : June 11, 2002
INVENTOR(S)   : Randall D. Hutchison, Robert Schiffbauer and Kevan Smith It is certified that error appears in the above-identified patent and that said Letters Patent is hereby corrected as shown below:

<u>Title page,</u>
Item [75], Inventors, delete "Shiffbauer" and substitute therefor -- Schiffbauer --

Signed and Sealed this

Eleventh Day of February, 2003

JAMES E. ROGAN
*Director of the United States Patent and Trademark Office*